United States Patent
Badami et al.

(10) Patent No.: US 9,514,981 B1
(45) Date of Patent: Dec. 6, 2016

(54) INTERCONNECT STRUCTURE

(71) Applicant: International Business Machines Corporation, Armonk, NY (US)

(72) Inventors: Dinesh A. Badami, Essex Junction, VT (US); Baozhen Li, South Burlington, VT (US); Wen Liu, South Burlington, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/970,687

(22) Filed: Dec. 16, 2015

Related U.S. Application Data

(63) Continuation of application No. 14/923,811, filed on Oct. 27, 2015.

(51) Int. Cl.
*H01L 21/68* (2006.01)
*H01L 21/768* (2006.01)

(52) U.S. Cl.
CPC ..... *H01L 21/76831* (2013.01); *H01L 21/7682* (2013.01); *H01L 21/76802* (2013.01); *H01L 21/76834* (2013.01); *H01L 21/76846* (2013.01); *H01L 21/76877* (2013.01)

(58) Field of Classification Search
CPC ............ H01L 21/7682; H01L 21/76831; H01L 21/6809
USPC ........................................................ 438/618
See application file for complete search history.

(56) References Cited

U.S. PATENT DOCUMENTS

| | | | |
|---|---|---|---|
| 6,245,667 B1 | 6/2001 | Wang et al. | |
| 6,849,537 B2 | 2/2005 | Honeycutt | |
| 8,298,911 B2 | 10/2012 | Lee | |
| 8,513,809 B2 | 8/2013 | Ueda | |
| 8,629,560 B2 | 1/2014 | Liu et al. | |
| 8,779,590 B2 | 7/2014 | Isobayashi | |
| 9,054,160 B2 | 6/2015 | Bruce et al. | |
| 9,142,533 B2 | 9/2015 | Shen et al. | |
| 2009/0081862 A1* | 3/2009 | Chen | H01L 21/76831 438/618 |
| 2011/0024909 A1* | 2/2011 | Yang | H01L 21/76805 257/751 |
| 2011/0210448 A1 | 9/2011 | Nitta et al. | |
| 2013/0277842 A1 | 10/2013 | Baumann et al. | |
| 2014/0151888 A1 | 6/2014 | Tsai et al. | |
| 2015/0162278 A1 | 6/2015 | Zhang et al. | |

OTHER PUBLICATIONS

Badami et al., "Interconnect Structure", U.S. Appl. No. 14/923,811, filed Oct. 27, 2015, 23 pages.
IBM, "List of IBM Patents or Patent Applications Treated as Related", Appendix P, 2 pages, dated May 20, 2016.

* cited by examiner

*Primary Examiner* — Kenneth Parker
*Assistant Examiner* — Warren H Kilpatrick
(74) *Attorney, Agent, or Firm* — Steven L. Fisher-Stawinski

(57) ABSTRACT

An interconnect structure includes a dielectric layer with one or more trenches extending therein, one or more interconnect lines, and one or more first liner layers. Each interconnect line is positioned within a trench. At least one first liner layer is affixed between the trench bottom surface and the interconnect bottom surface. The interconnect structure further includes one or more second liner layers. At least one of the second liner layers is affixed directly to the interconnect top surface and at least one interconnect side surface. The interconnect structure further includes at least one air gap. Each air gap is positioned between the trench side surface and the interconnect side surface. A corresponding method of manufacture and product of a method of manufacture are also disclosed.

1 Claim, 4 Drawing Sheets

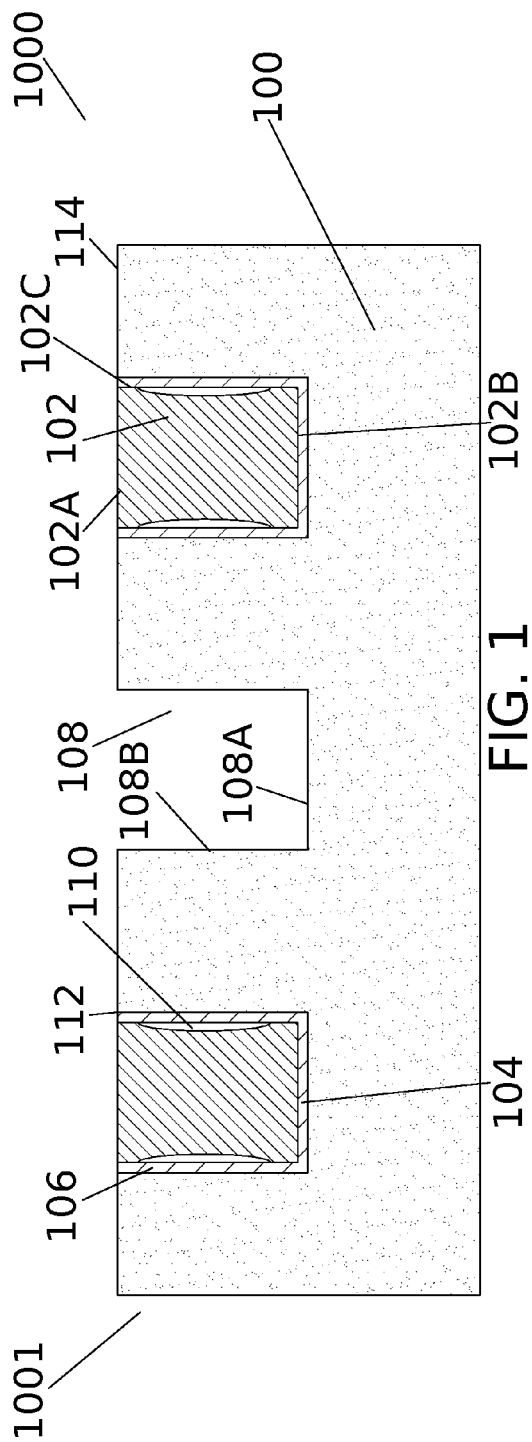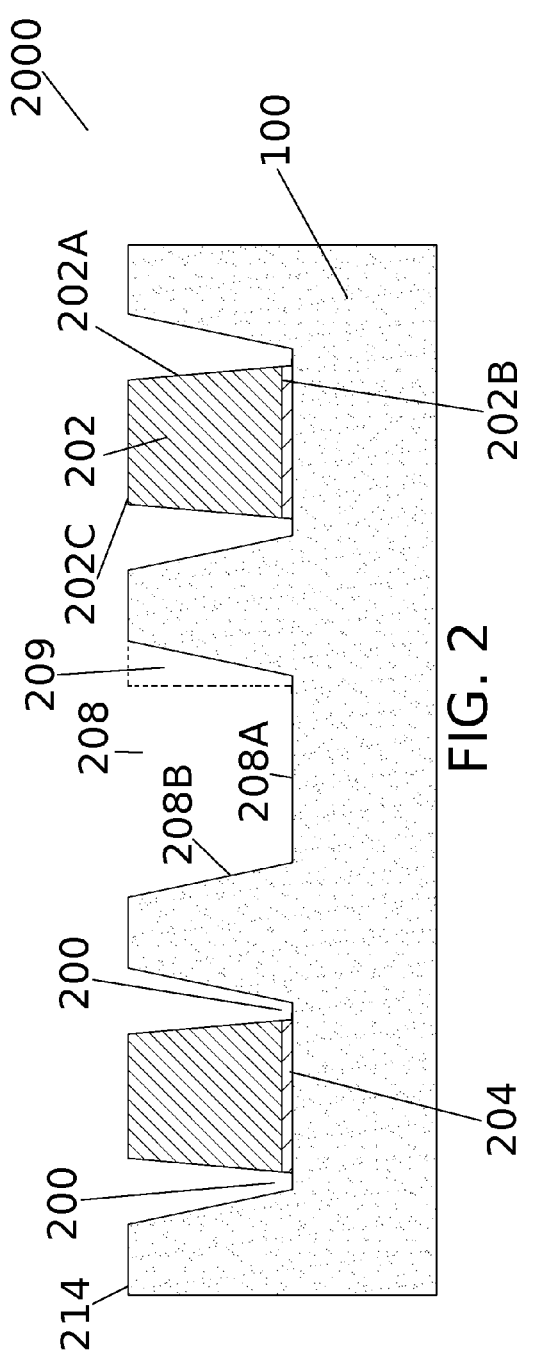

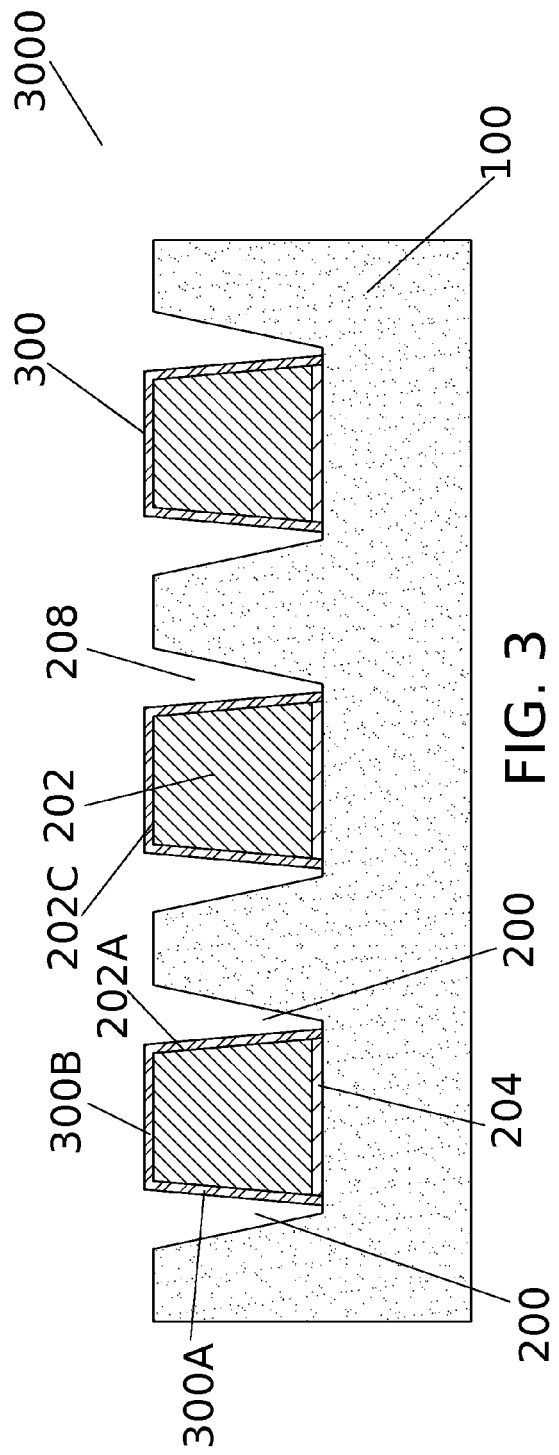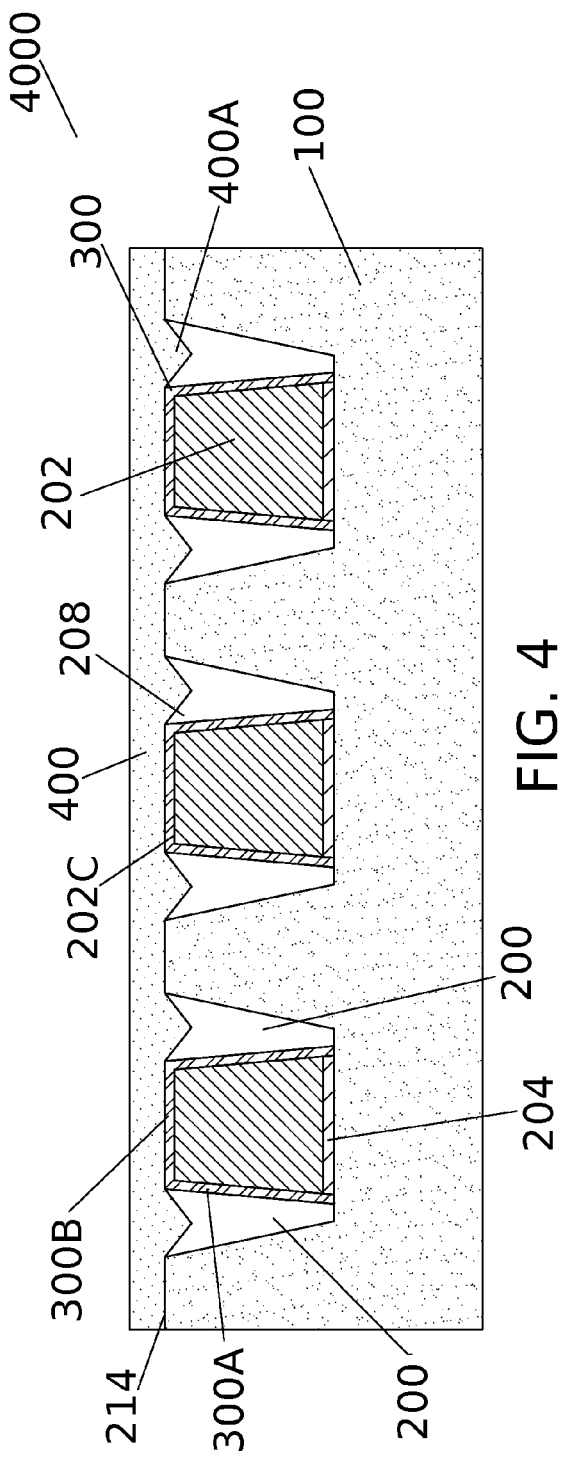

INTERCONNECT STRUCTURE

BACKGROUND

The present invention relates generally to the field of interconnects in integrated circuits, and more particularly to depositing and shaping liner materials for copper and other metal interconnects.

Integrated circuits transport signals between, among, into, and out of various circuit components and layers via interconnects. Interconnects are typically surrounded by one or more layers of liner material. Liner materials may be engineered or formed as an artefact of the deposition process. The liner material's electrical properties directly or indirectly affect the interconnect's overall resistance, which affects performance, as well as the interconnect's susceptibility to electromigration and time-dependent dielectric breakdown, which affect reliability.

Electromigration is the transport of material caused by the gradual movement of ions in the conductive interconnect due to the momentum transfer between conducting electrons and diffusing metal atoms. Excessive electromigration over time damages the interconnect, ultimately causing signal loss and failure of the circuit that depends on the interconnect.

Time-dependent dielectric breakdown is a result of long-time application of relatively low electric field, which can occur across dielectric layers between the interconnect and other circuit components. The breakdown is caused by the formation of a conducting path through the dielectric due to electron tunneling current.

As circuit components grow ever smaller and more densely placed, engineers and designers of integrated circuit interconnects continue to face challenges with performance and reliability of interconnects and the interconnect liners.

SUMMARY

An interconnect structure includes a dielectric layer. The dielectric layer is shaped with one or more trenches extending therein from the dielectric layer top surface. Each trench includes a trench bottom surface and at least one trench side surface. The interconnect structure further includes one or more interconnect lines. Each interconnect line includes an interconnect bottom surface, an interconnect top surface, and at least one interconnect side surface. The interconnect structure further includes one or more first liner layers, which are made of a first liner material. Each interconnect line is positioned within a trench. At least one first liner layer is affixed between the trench bottom surface and the interconnect bottom surface. The interconnect structure further includes one or more second liner layers, which are made of a second liner material. At least one of the second liner layers is affixed directly to the interconnect top surface and at least one interconnect side surface. The interconnect structure further includes at least one air gap. Each air gap is positioned between the trench side surface and the interconnect side surface.

A corresponding method of manufacturing an interconnect structure and the product of the method of manufacture are also disclosed. The method includes producing an initial structure. The initial structure includes a dielectric layer. The dielectric layer is shaped with one or more trenches extending therein from the dielectric layer top surface. Each trench includes a trench bottom surface and at least one trench side surface. The initial structure further includes one or more interconnect lines. Each interconnect line includes an interconnect bottom surface, an interconnect top surface, and at least one interconnect side surface. The initial structure further includes one or more first liner layers, which are made of a first liner material. Each interconnect line is positioned within a trench. At least one first liner layer is affixed between the trench bottom surface and the interconnect bottom surface, between at least one trench side surface and at least one interconnect side surface, and atop the interconnect top surface.

The method further includes removing the one or more first liner layers from the interconnect top surface and the at least one interconnect side surface together with a quantity of material from the dielectric layer at the at least one trench side surface to yield at least one air gap. The air gap is positioned between the trench side surface and the interconnect side surface. The method further includes depositing one or more second liner layers onto the interconnect top surface and the at least one interconnect side surface. At least one second liner layer is made of a second liner material. Possible results of the method include that at least one interconnect side surface is free of sidewall voids, and that the interconnect top surface is free of triple points.

BRIEF DESCRIPTION OF THE DRAWINGS

FIG. 1 is a cross-sectional view of various interconnect structures in an initial state, in accordance with at least one embodiment of the present invention.

FIG. 2 is a cross-sectional view of various interconnect structures in an intermediate state, in accordance with at least one embodiment of the present invention.

FIG. 3 is a cross-sectional view of various interconnect structures, in accordance with at least one embodiment of the present invention.

FIG. 4 is a cross-sectional view of various interconnect structures covered by a capping layer, in accordance with at least one embodiment of the present invention.

DETAILED DESCRIPTION

The invention is directed to an interconnect structure for which some, but not necessarily all, embodiments may exhibit improved resistance against electromigration and time-dependent dielectric breakdown. The inventors have observed, generally, that initially deposited interconnect liners, whether engineered or artefacts of the deposition process, are often suboptimal for the interconnect application. Specifically, the inventors have observed that an overly thick liner layer may create excessive resistance in the interconnect, while a liner layer that is too thin may create unacceptably high electromigration and time-dependent dielectric breakdown, which increases the likelihood of failure.

Figure 6:
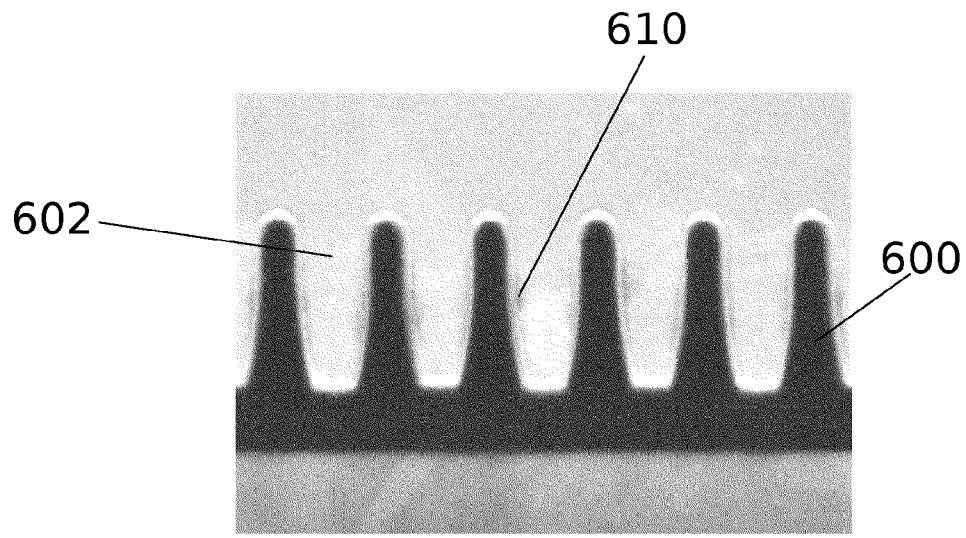
FIG. 6 is a microscopic photograph displaying a cross-sectional view of various interconnect structures that exemplify a sidewall void defect.

In addition, the inventors have observed that the presence of sidewall void defects may be a severe source of electromigration performance degradation. FIG. 6 displays a microscopic photograph of a cross section of an interconnect structure with various interconnect lines 602 (the light material) displayed against a dielectric layer 600 (the dark material). In the photographed material of FIG. 6, the dark spots 610 in the sides of the interconnects 602 are sidewall voids.

Figure 7:
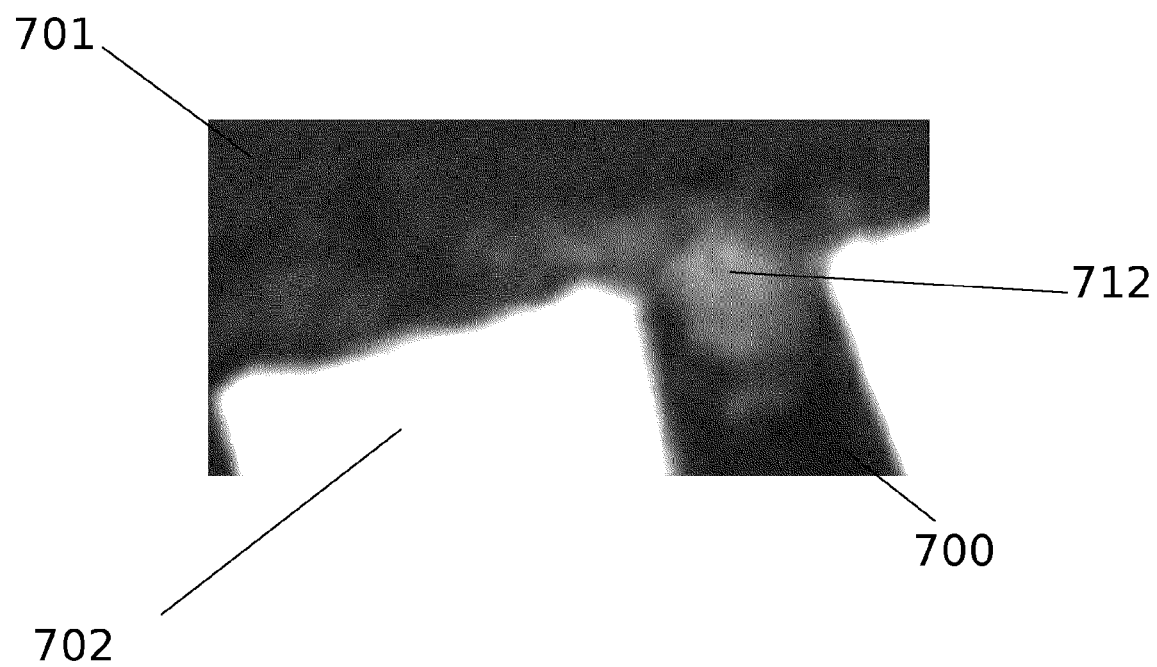
FIG. 7 is a microscopic photograph displaying a cross-sectional view of various interconnect structures that exemplify a triple point failure defect.

The inventors have further observed that the triple point between the interconnect line, dielectric layer, and a capping layer may be the weakest spot, and thus a likely point of failure, for time-dependent dielectric breakdown. FIG. 7 displays a microscopic photograph of a cross section of an interconnect structure with various interconnect lines 702 (light material) between dielectric material 700 and a capping layer 701 (both dark material). In the photographed material of FIG. 7, the light spot at the triple point 712 has become a conductive pathway due to time-dependent dielectric breakdown. Based on their observations, the inventors have further observed that recessing the interconnect material from the triple point reduced the risk of time-dependent dielectric breakdown.

The inventors have further observed that, in some, but not necessarily all, embodiments of the present invention, it may be possible to achieve some and/or all of: (i) install an optimal liner thickness; (ii) eliminate sidewall voids after deposition; and (iii) remove triple points in interconnects by application of various structures and methods disclosed herein. It should be appreciated that neither the invention, nor any particular embodiment thereof, requires any of the above-described features or advantages to necessarily be present in order to be practiced as described and claimed herein.

Referring now to the invention in more detail, FIG. 1 presents a sectional view of various interconnect structures in an initial state, in accordance with at least one embodiment of the present invention. In FIG. 1, the initial state is generally designated step 1000. Step 1000 includes producing an initial structure 1001, which refers generally to at least one of the three sections of interconnect structures shown. In FIG. 1, the left and right structures should be understood to be identical interconnect structures, which need not necessarily occur together and may, in practiced embodiments, have different interconnect width and/or depth. Reference numbers for the left and right interconnect structures are split between the two so as to avoid crowding the Figure, however it should be understood that the structures to which the reference numbers refer are repeated on each side. In FIG. 1, the central structure is shown without any interconnect present for the purpose of identifying the properties of a trench 108. It should be appreciated that the trench 108 of the central structure is displayed without an associated interconnect structure for explanation purposes only, and that such unfilled trenches need not occur in practice of various embodiments of the invention.

Referring still to FIG. 1, the initial structure 1001 includes a dielectric layer 100. The dielectric layer 100 includes a dielectric layer top surface 114. The dielectric layer 100 is shaped with one or more trenches 108 extending therein from the dielectric layer top surface 114. Each of the one or more trenches 108 includes a trench bottom surface 108A and at least one trench side surface 108B. The initial structure 1001 further includes one or more interconnect lines 102. Each of the one or more interconnect lines 102 includes an interconnect top surface 102A, an interconnect bottom surface 102B, and at least one interconnect side surface 102C. The one or more interconnect lines 102 are made of a metal interconnect material. Examples of metal interconnect materials include, but are not limited to, copper metal, alloys of copper, aluminum, alloys of aluminum, and other electrically conductive metal or non-metal materials.

Referring still to FIG. 1, the initial structure 1001 includes one or more first liner layers 104. The one or more first liner layers are made of a first liner material. The first liner material may include material layers that are engineered (i.e. deposited by design) or self-formed (i.e. an artefact of deposition). Example first liner materials include, but are not limited to, metal nitride diffusion barrier materials such as tantalum nitride (TaN), titanium nitride (TiN), tungsten nitride (WN), cobalt nitride (CoN), and ruthenium nitride (RuN), as well as other diffusion barrier materials such as (e.g. self-formed) $MnSi_xO_y$. The first liner material may be deposited by chemical or physical vapor deposition at the time of depositing the interconnect lines 102.

Referring still to FIG. 1, each of the one or more interconnect lines 102 are positioned within one of the one or more trenches 108. At least one of the one or more first liner layers 104 is affixed between the trench bottom surface 108A and the interconnect bottom surface 102B and between the at least one trench side surface 108B and the at least one interconnect side surface 102C. The first liner layer may also be applied to the interconnect top surface 102A.

As shown, the initial structure 1001 may include sidewall void defects such as the sidewall void 110, and may intrinsically include a triple point 112 at the location where the boundary between the interconnect side surface 102C and the trench side surface 108B meets the dielectric layer top surface 114, which may be in interface with any of a number of capping layers or other circuit components.

FIG. 2 presents a sectional view of various interconnect structures in an intermediate state, in accordance with at least one embodiment of the present invention. In FIG. 2, the intermediate state is generally designated step 2000. In FIG. 2, the left and right structures should be understood to be identical interconnect structures, which need not necessarily occur together and may, in practiced embodiments, have different interconnect width and/or depth. Reference numbers for the left and right interconnect structures are split between the two so as to avoid crowding the Figure, however it should be understood that the structures to which the reference numbers refer are repeated on each side. In FIG. 2, the central structure is shown without any interconnect present for the purpose of identifying the properties of an enlarged trench 208. It should be appreciated that the trench 208 of the central structure is displayed without an associated interconnect structure for explanation purposes only, and that such unfilled trenches need not occur in practice of various embodiments of the invention.

Referring still to the embodiment depicted in FIG. 2, the dielectric layer 100, as modified in step 2000, may include the dielectric layer top surface 214. The dielectric layer 100 may, after step 2000, be shaped with one or more trenches 208 extending therein from the dielectric layer top surface 214. Each of the one or more trenches 208 includes a trench bottom surface 208A and at least one trench side surface 208B. The interconnect structure of the embodiment depicted in FIG. 2 may further include one or more interconnect lines 202. Each of the one or more interconnect lines 202 may include an interconnect bottom surface 202B, an interconnect top surface 202C, and at least one interconnect side surface 202A. The interconnect structure of the embodiment depicted in FIG. 2 may further include one or more first liner layers 204. The one or more first liner layers 204 may be made of the first liner material, as described above. Each of the one or more interconnect lines 202 may be positioned within one of the one or more trenches 208.

Step 2000 includes removing the one or more first liner layers 104 from the interconnect top surface 102A and interconnect side surface 102C together with a quantity of material 209 from the dielectric layer 100 and interconnect material 202 to yield at least one air gap 200. The removal may be achieved by various means including, but not limited to, selective plasma dry etch or wet chemistry. For the quantity of material 209, the dashed line may be understood to represent the boundary of the trench side surface 108B before the removal at step 2000. The remaining, modified, first liner layer 204 remains affixed between the trench bottom surface 208A and the interconnect bottom surface 202B. The removal may also affect the shape of the interconnect 202 such that the interconnect side surface 202A and interconnect side surface 202A and interconnect top surface 202C have lost material, as shown. Similarly, the dielectric layer top surface 214 may be reduced or otherwise modified by the removal of step 2000. The at least one air gap 200 may be positioned between the at least one trench side surface 208B and the at least one interconnect side surface 202A. As shown in FIG. 2, the sidewall voids 110 are not present due to the removal of the quantity of material 209. Thus, the interconnect side surface 202A may be understood to be free of sidewall voids 110, which may be eliminated by the removal activity of step 2000. Similarly, the removal activity of step 2000 may recess the metal interconnect material of the interconnect top surface 202C from the dielectric layer 100 such that the air gap 200 exists where the initially may have been a triple point 112. Thus, in some embodiments, after step 2000, the interconnect top surface 202C may be understood to be free of triple points 112.

FIG. 3 presents a sectional view of various interconnect structures, in accordance with at least one embodiment of the present invention. In FIG. 3, the depicted state of the structure of the invention is generally designated step 3000. In FIG. 3, the left, center and right structures should be understood to be identical interconnect structures, which need not necessarily occur together and may, in practiced embodiments, have different interconnect width and/or depth. Reference numbers for the left, center, and right interconnect structures are split between the three so as to avoid crowding the Figure, however it should be understood that the structures to which the reference numbers refer are repeated on each side.

Referring still to FIG. 3, the dielectric layer 100 includes the one or more trenches 208 with the one or more interconnect lines 202 positioned therein and the first liner layer 204 beneath each interconnect line 202. In the embodiment depicted in FIG. 3, the interconnect structure further includes one or more second liner layers 300. The one or more second liner layers 300 may be made of a second liner material. At least one of the one or more second liner layers 300 may be affixed directly to the interconnect top surface 202C (e.g. a second liner layer top surface 300B) and to at least one of said at least one interconnect side surface 202A (e.g. a second liner layer side surface 300A).

Step 3000, as depicted, may include depositing one or more second liner layers 300 onto the interconnect top surface 202C and onto the at least one interconnect side surface 202A. At least one of the one or more second liner layers 300 may be made of the second liner material. The second liner material may include a highly conductive metal cap material as well as various metal nitride diffusion barriers and pure or alloyed metals. The second liner material may be deposited, in step 3000, by selective deposition via atomic layer deposition, chemical vapor deposition, or other means. The first and second liner materials may be the same, similar, or different materials. In some embodiments, the second liner material may be highly adhesive to the copper or other metal material of the interconnect line 202. More generally, the second line material may be more adhesive to the metal interconnect material than the first liner material.

FIG. 4 presents a sectional view of various interconnect structures covered by a capping layer 400, in accordance with at least one embodiment of the present invention. In FIG. 4, the depicted state of the structure of the invention is generally designated step 4000. In FIG. 4, the left, center and right structures should be understood to be identical interconnect structures, which need not necessarily occur together and may, in practiced embodiments, have different interconnect width and/or depth. Reference numbers for the left, center, and right interconnect structures are split between the three so as to avoid crowding the Figure, however it should be understood that the structures to which the reference numbers refer are repeated on each side.

Referring still to FIG. 4, the dielectric layer 100 includes the one or more trenches 208 with the one or more interconnect lines 202 positioned therein and the first liner layer 204 beneath each interconnect line 202. In the embodiment depicted in FIG. 3, the interconnect structure further includes one or more second liner layers 300. The one or more second liner layers 300 may be made of a second liner material.

Step 4000 includes depositing at least one capping layer 400 onto the dielectric layer top surface 214 and the interconnect top surface 202C such that: (i) at least one of the one or more second liner layers 300 is affixed between the interconnect top surface 202C and the capping layer 400 (e.g. the second liner layer top surface 300B); and (ii) at least one of the at least one air gap 200 is enclosed by the capping layer 400. Similarly, the interconnect structure of the embodiment depicted in FIG. 4 may include at least one capping layer 400. The at least one capping layer 400 may be affixed to the dielectric layer top surface 214. The at least one capping layer may be affixed to the interconnect top surface such that (i) at least one of the one or more second liner layers 300 is affixed between the interconnect top surface 202C and the capping layer 400 (e.g. the second liner layer top surface 300B); and (ii) at least one of the at least one air gap 200 is enclosed by the capping layer 400.

As shown in FIG. 4, the capping layer 400 may include one or more capping layer artefacts 400A, which extend into the air gaps 200. The capping layer artefacts 400A need not be functional for practice of the invention in all embodiments and be treated, in some embodiments, as side effects of the deposition process.

The at least one capping layer may be made of a capping layer dielectric material. The capping layer dielectric material may include a dielectric such as silicon carbide (SiC), amorphous silicon nitride, silicon oxynitride, etc. In the embodiment of FIG. 4, the capping layer dielectric material may be a "low-K" material, wherein the material has a dielectric constant K less than four (4).

Figure 5:
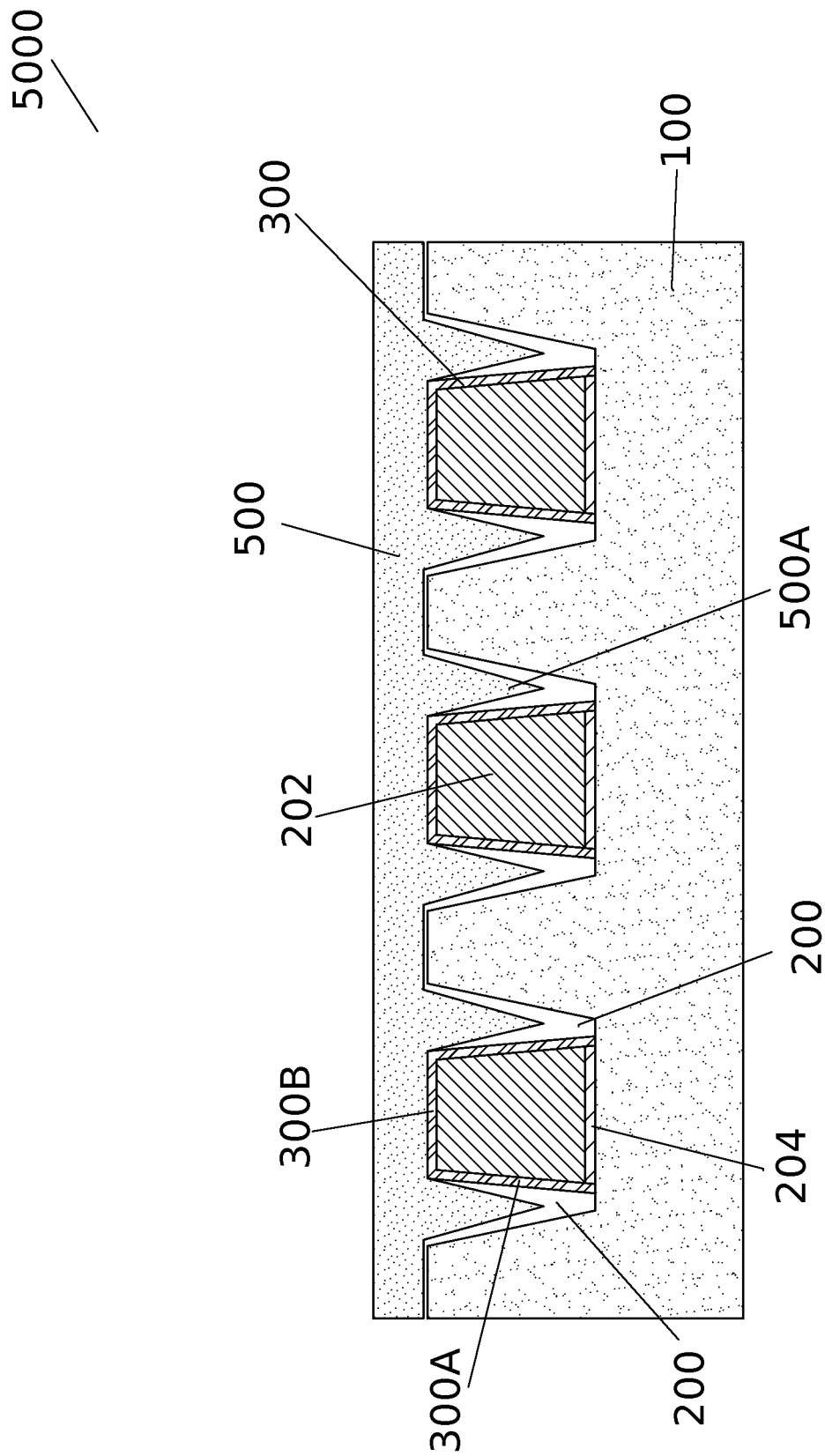
FIG. 5 is a cross-sectional view of various interconnect structures covered by an alternative capping layer, in accordance with at least one embodiment of the present invention.

FIG. 5 presents a sectional view of various interconnect structures covered by a capping layer 500, in accordance with at least one embodiment of the present invention. In FIG. 5, the depicted state of the structure of the invention is generally designated step 5000. In FIG. 5, the left, center and right structures should be understood to be identical interconnect structures, which need not necessarily occur together, and may, in practiced embodiments, have different interconnect width and/or depth. Reference numbers for the left, center, and right interconnect structures are split between the three so as to avoid crowding the Figure, however it should be understood that the structures to which the reference numbers refer are repeated on each side.

As shown in FIG. 5, step 5000 may be understood as a broadly similar alternative to step 4000, wherein the capping layer 500 may include one or more capping layer artefacts 500A, which extend into the air gaps 200 and may be of a different size and shape than the capping layer artefacts 400A. The capping layer artefacts 500A need not be functional for practice of the invention in all embodiments and be treated, in some embodiments, as side effects of the deposition process. In the embodiment of FIG. 5, the capping layer dielectric material may be a "high-K" material, wherein the material has a dielectric constant K between four (4) and seven point five (7.5).

While the foregoing written description of the invention enables one of ordinary skill to make and use what is presently considered to be the best mode thereof, those of ordinary skill in the art will understand and appreciate the existence of variations, combinations, and equivalents of the specific embodiment, method, and examples herein. The invention should, therefore, not be limited by the above described embodiment, method, and examples, but by all embodiments and methods within the scope and spirit of the invention.

What is claimed is:

1. A method of manufacturing an interconnect structure, comprising:
    producing an initial structure, said initial structure comprising:
        a dielectric layer, said dielectric layer comprising a dielectric layer top surface, said dielectric layer being shaped with one or more trenches extending therein from said dielectric layer top surface, each of said one or more trenches comprising a trench bottom surface and at least one trench side surface;
        one or more interconnect lines, each of said one or more interconnect lines comprising an interconnect bottom surface, an interconnect top surface, and at least one interconnect side surface;
        one or more first liner layers, said one or more first liner layers being made of a first liner material;
        each of said one or more interconnect lines being positioned within one of said one or more trenches; and
        at least one of said one or more first liner layers being affixed between said trench bottom surface and said interconnect bottom surface and between said at least one trench side surface and said at least one interconnect side surface;
    removing said one or more first liner layers from said interconnect top surface and said at least one interconnect side surface together with a quantity of material from said at least one interconnect side surface and said dielectric layer at said at least one trench side surface to yield at least one air gap, said at least one air gap being positioned between said at least one trench side surface and said at least one interconnect side surface;
    depositing one or more second liner layers onto said interconnect top surface and onto said at least one interconnect side surface, at least one of said one or more second liner layers being made of a second liner material; and
    depositing at least one capping layer, said at least one capping layer being made of a capping layer dielectric material, onto said dielectric layer top surface and said interconnect top surface such that:
        said at least one of said one or more second liner layers is affixed between said interconnect top surface and said capping layer; and
        at least one of said at least one air gap being enclosed by said capping layer;
    wherein said second liner material comprises a highly conductive metal cap material;
    wherein said one or more interconnect lines are made of a metal interconnect material;
    wherein said second liner material is more adhesive to said metal interconnect material than said first liner material;
    whereby said quantity of material removed from said at least one interconnect side surface is effective such that said at least one interconnect side surface is free of sidewall voids; and
    whereby said interconnect top surface is sufficiently recessed from said dielectric layer and said at least one capping layer so as to be free of triple points.

* * * * *